United States Patent
Hanawa et al.

(10) Patent No.: US 11,133,215 B2
(45) Date of Patent: Sep. 28, 2021

(54) GLASS SUBSTRATE, LAMINATED SUBSTRATE, LAMINATED SUBSTRATE MANUFACTURING METHOD, LAMINATE, PACKAGE, AND GLASS SUBSTRATE MANUFACTURING METHOD

(71) Applicant: AGC Inc., Chiyoda-ku (JP)

(72) Inventors: Yu Hanawa, Tokyo (JP); Shuhei Nomura, Tokyo (JP); Kazutaka Ono, Tokyo (JP); Nobuhiko Takeshita, Tokyo (JP); Keisuke Hanashima, Tokyo (JP)

(73) Assignee: AGC Inc., Chiyoda-ku (JP)

( * ) Notice: Subject to any disclaimer, the term of this patent is extended or adjusted under 35 U.S.C. 154(b) by 523 days.

(21) Appl. No.: 15/877,509

(22) Filed: Jan. 23, 2018

(65) Prior Publication Data
US 2018/0151408 A1  May 31, 2018

Related U.S. Application Data

(63) Continuation of application No. PCT/JP2016/071172, filed on Jul. 19, 2016.

(30) Foreign Application Priority Data

Jul. 24, 2015  (JP) .............................. JP2015-147249
Dec. 28, 2015  (JP) .............................. JP2015-256895

(51) Int. Cl.
  *H01L 21/56*  (2006.01)
  *H01L 21/687*  (2006.01)
  (Continued)

(52) U.S. Cl.
  CPC .. *H01L 21/68757* (2013.01); *B32B 17/10036* (2013.01); *B32B 17/10889* (2013.01);
  (Continued)

(58) Field of Classification Search
  CPC ... H01L 23/15; H01L 2223/544–54493; H01L 21/02422; H01L 2223/54426;
  (Continued)

(56) References Cited

U.S. PATENT DOCUMENTS

4,061,228 A * 12/1977 Johnson ............... B65D 25/107
  206/454
6,242,817 B1 * 6/2001 Grande ................. H01L 21/187
  257/48
(Continued)

FOREIGN PATENT DOCUMENTS

JP  03-109814 U  11/1991
JP  2002-231665  8/2002
(Continued)

OTHER PUBLICATIONS

G. R. Trott and A. Shorey, "Glass wafer mechanical properties: A comparison to silicon," 2011 6th International Microsystems, Packaging, Assembly and Circuits Technology Conference (IMPACT), Taipei, 2011, pp. 359-362, doi: 10.1109/IMPACT .2011.6117158. (Year: 2011).*

(Continued)

*Primary Examiner* — Lee E Sanderson
*Assistant Examiner* — Michael C Romanowski
(74) *Attorney, Agent, or Firm* — Oblon, McClelland, Maier & Neustadt, L.L.P.

(57) ABSTRACT

A glass substrate is laminated with a substrate containing silicon to thereby form a laminated substrate. The glass substrate has a concave surface and a convex surface and has one or more marks that distinguish between the concave surface and the convex surface.

22 Claims, 12 Drawing Sheets

(51) Int. Cl.
| | |
|---|---|
| *C03B 33/023* | (2006.01) |
| *H01L 23/15* | (2006.01) |
| *H01L 23/00* | (2006.01) |
| *B32B 17/00* | (2006.01) |
| *B65D 85/48* | (2006.01) |
| *C03B 33/02* | (2006.01) |
| *H01L 21/67* | (2006.01) |
| *G05B 1/00* | (2006.01) |
| *H01L 23/544* | (2006.01) |
| *C03C 27/10* | (2006.01) |
| *B32B 17/10* | (2006.01) |

(52) U.S. Cl.
CPC .............. *B65D 85/48* (2013.01); *C03B 33/02* (2013.01); *C03B 33/0235* (2013.01); *C03C 27/10* (2013.01); *G05B 1/00* (2013.01); *H01L 21/56* (2013.01); *H01L 21/67282* (2013.01); *H01L 23/544* (2013.01); *H01L 2223/54493* (2013.01)

(58) Field of Classification Search
CPC ......... H01L 2223/54493; H01L 23/544; B32B 2457/14; B32B 2457/04; C03C 27/10
See application file for complete search history.

(56) References Cited

U.S. PATENT DOCUMENTS

| | | | | |
|---|---|---|---|---|
| 6,774,340 | B1* | 8/2004 | Chiba | ..................... B41M 5/24 219/121.68 |
| 2002/0090799 | A1* | 7/2002 | Vepa | ..................... H01L 23/544 438/459 |
| 2002/0115294 | A1* | 8/2002 | Watanabe | ............... H01L 22/20 438/690 |
| 2012/0276689 | A1* | 11/2012 | Canale | .................... C03C 17/00 438/106 |
| 2015/0076662 | A1* | 3/2015 | Aida | ..................... H01L 21/187 257/615 |

FOREIGN PATENT DOCUMENTS

| | | |
|---|---|---|
| TW | 201522269 A | 6/2015 |
| WO | WO 2013/161906 A1 | 10/2013 |
| WO | WO 2015/037478 A1 | 3/2015 |

OTHER PUBLICATIONS

Product Data Sheet for Corning Eagle XG(R), Aug. 2013 (Year: 2013).*
International Search Report dated Sep. 20, 2016 in PCT/JP2016/071172 filed Jul. 19, 2016 (with English Translation).
Written Opinion dated Sep. 20, 2016 in PCT/JP2016/071172 filed Jul. 19, 2016.

* cited by examiner

GLASS SUBSTRATE, LAMINATED SUBSTRATE, LAMINATED SUBSTRATE MANUFACTURING METHOD, LAMINATE, PACKAGE, AND GLASS SUBSTRATE MANUFACTURING METHOD

TECHNICAL FIELD

The present invention relates to a glass substrate, a laminated substrate, a process for producing the laminated substrate, a laminate, packages, and a process for producing the glass substrate.

BACKGROUND ART

In a field of semiconductor devices, a degree of integration in devices is increasing, while size reductions are proceeding. There is accordingly a growing desire for a technique for packaging devices having a high degree of integration. In conventional semiconductor assembly steps, a glass substrate and a substrate containing silicon, both in a wafer state, are separately cut, and the glass substrate and the substrate containing silicon are then stuck to each other and subjected to a series of assembly steps including die bonding, wire bonding, and molding.

In recent years, a wafer-level packaging technique is being highlighted in which a glass substrate and a substrate containing silicon, both in a full-size wafer state, are stuck to each other and the laminate is subjected to assembly steps and then cut. In Patent Document 1, for example, a supporting glass substrate for use in wafer-level packaging is proposed.

PRIOR ART DOCUMENT

Patent Document

Patent Document 1: International Publication WO 2015/037478

SUMMARY OF THE INVENTION

Problem that the Invention is to Solve

In the production of glass substrates, a completely flat glass is difficult to produce on a mass production level, and there is a problem in that a glass substrate having waviness is produced. In wafer-level packaging, in cases where a glass substrate having waviness is used in sticking the glass substrate to a substrate containing silicon to obtain a laminated substrate, there is a problem in that a space is prone to be formed between the glass substrate and the substrate containing silicon, resulting in bubble inclusion.

Accordingly, the present invention provides a glass substrate which, when used in sticking the glass substrate to a substrate containing silicon to obtain a laminated substrate, is less apt to cause bubble inclusion between the glass substrate and the substrate containing silicon, and further provides a laminated substrate, a process for producing the laminated substrate, a laminate, packages, and a process for producing the glass substrate.

Means for Solving the Problems

A glass substrate according to the present invention is a glass substrate to be laminated with a substrate containing silicon to thereby form a laminated substrate, the glass substrate having a concave surface and a convex surface and having one or more marks that distinguish between the concave surface and the convex surface.

A laminated substrate according to the present invention is formed by laminating the convex surface of the glass substrate to a substrate containing silicon.

A process according to the present invention for producing a laminated substrate includes sticking (pasting) a curved surface constituted of the convex surface or concave surface of the glass substrate and a curved surface constituted of a convex surface or concave surface of a substrate containing silicon to each other so as to conform to each other.

A laminate according to the present invention includes the laminated substrate and another glass substrate that is stuck (pasted) to the glass substrate that is a component of the laminated substrate.

A package according to the present invention is formed by packaging two or more glass substrates, wherein the glass substrates are packaged so that the convex surface of one of the glass substrates faces the concave surface of another glass substrate.

A package according to the present invention is formed by packaging two or more laminated substrates, wherein the laminated substrates are packaged so that the substrate containing silicon that is a component of one of the laminated substrates faces the concave surface of the glass substrate that is a component of another laminated substrate.

A package according to the present invention is formed by packaging two or more laminates, wherein the substrate containing silicon that is a component of one of the laminates faces the concave surface of the glass substrate that is a component of another laminate.

A process according to the present invention is a process for producing a glass substrate to be laminated with a substrate containing silicon to thereby form a laminated substrate, the process including:

a melting step of heating raw materials for glass to obtain a molten glass;

a forming step of forming the molten glass into a plate shape to obtain a glass ribbon;

a slow cooling step of slowly cooling the glass ribbon;

a cutting step of cutting the glass ribbon to obtain a glass substrate;

an inspection step of discriminating a concave surface and a convex surface in the glass substrate; and a step of placing a mark on at least one of the concave surface and the convex surface, thereby obtaining the glass substrate.

Effect of the Invention

According to the glass substrate, laminated substrate, process for producing the laminated substrate, laminate, packages, and process for glass substrate production of the present invention, bubble inclusion is less apt to occur between the glass substrate and a substrate containing silicon in sticking the glass substrate to the substrate containing silicon to obtain a laminated substrate.

BRIEF DESCRIPTION OF THE DRAWINGS

FIG. 1A is a cross-sectional view illustrating the glass substrate which has not been stuck, and FIG. 1B is a cross-sectional view of the glass substrate which has been stuck.

FIG. 2A is a top view, FIG. 2B is a bottom view, and FIG. 2C is a cross-sectional view.

FIG. 3A is a top view, FIG. 3B is a bottom view, and FIG. 3C is a cross-sectional view.

FIG. 5A is a plan view, and FIG. 5B and FIG. 5C are cross-sectional views.

FIG. 6A is a plan view, and FIG. 6B and FIG. 6C are cross-sectional views.

FIG. 7A is a top view, FIG. 7B is a bottom view, and FIG. 7C is a cross-sectional view.

FIG. 8A is a top view, FIG. 8B is a bottom view, and FIG. 8C is a cross-sectional view.

FIG. 9A is a top view, FIG. 9B is a bottom view, and FIG. 9C is a cross-sectional view.

MODES FOR CARRYING OUT THE INVENTION

Embodiments of the present invention are explained below in detail by reference to the drawings.

Figure 1A:
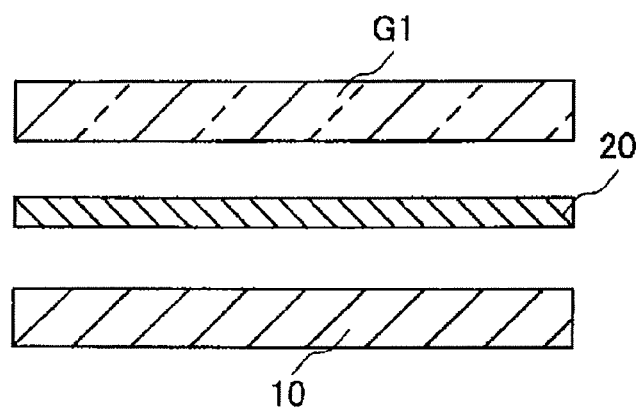
FIG. 1A and FIG. 1B show a glass substrate of a first embodiment of the present invention which is stuck to a substrate containing silicon.
Figure 1B:
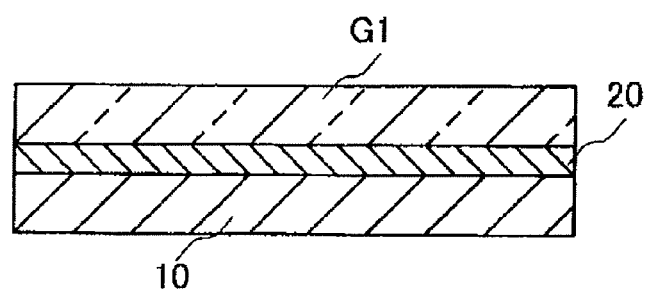

First, glass substrates according to a first embodiment of the present invention are explained. FIG. 1A and FIG. 1B are cross-sectional views of a glass substrate of the first embodiment of the present invention which is stuck to a substrate containing silicon.

The glass substrate G1 of the first embodiment of the present invention shown in FIG. 1A is stuck to a substrate containing silicon 10 at an ambient temperature of, for example, 200° C.-400° C., with a resin 20 interposed therebetween, thereby obtaining a laminated substrate 30 shown in FIG. 1B.

As the substrate containing silicon 10, use is made, for example, of a full-size wafer (e.g., silicon wafer).

The substrate containing silicon 10 may be, for example, a wafer having elements formed thereon or a substrate including chips of elements (e.g., silicon chips) cut out of a wafer and molded by resin. Furthermore, the substrate 10 may be a substrate configured of a silicon substrate, e.g., a silicon wafer or silicon chips, and a non-silicon substrate such as a glass substrate, e.g., TGV, or a resin substrate. In this case, the silicon substrate and the glass substrate are connected to each other by wiring with copper, etc.

The resin 20 is a resin capable of withstanding temperatures of, for example, 200° C.-400° C.

The glass substrate of the first embodiment of the present invention is suitable for use as a supporting glass substrate for fan-out type wafer-level packages. The glass substrate is suitable also as a glass substrate for image sensors, such as MEMS, CMOS, and CIS, for which element size reduction by wafer-level packaging is effective, and as a substrate having through-holes formed therein which is for use as a glass interposer (GIP) and a support glass for semiconductor back grinding.

The glass substrate of the first embodiment of the present invention has no waviness and has such curved surfaces that one of the main surfaces is a concave surface and the other main surface, which faces said main surface, is a convex surface.

The term "convex surface" or "concave surface" as used in the present invention means whether a curved surface is a macroscopically convex surface or concave surface distinguished using the SEMI standards. Consequently, the expression "having no waviness" used for the glass substrate of the first embodiment does not mean that there is no microscopic waviness in the glass substrate.

Whether a surface is a "convex surface" or "concave surface" according to the present invention may be determined specifically by using BOW (MF534) or WARP (MF657, MF1390) of the SEMI standards. In the case of even warpage, BOW may be used. In the case where there is waviness, WARP may be used.

According to BOW, the substrate is held unclamped, and the warpage is expressed in terms of distance from a designated reference plane to the surface of the substrate center. The surface located on a reference plane side is regarded as a concave surface, and the surface on a reverse side from the concave surface is regarded as a convex surface. The reference plane is determined by a substrate-thickness center line.

According to WARP, the substrate is held unclamped, and the warpage is expressed in terms of a difference between a maximum value and a minimum value of the distance between a designated reference plane and the substrate center plane. The reference plane is determined by the least square method, and the substrate center plane is set so that the difference between the maximum value and the minimum value is minimum. The surface on a side where the distance has the maximum value is regarded as a convex surface, and the surface on a side where the distance has the minimum value is regarded as a concave surface.

From a macroscopic standpoint, the convex surface has no reverse warpage which constitutes a recess. It is preferable that the convex surface should have a small curvature, from the standpoint of preventing the laminated substrate from warping considerably. It is hence difficult to determine which surface is a concave surface or a convex surface, when sticking to a substrate containing silicon. It is therefore necessary to place marks with which the concave surface can be distinguished from the convex surface.

Figure 2A:
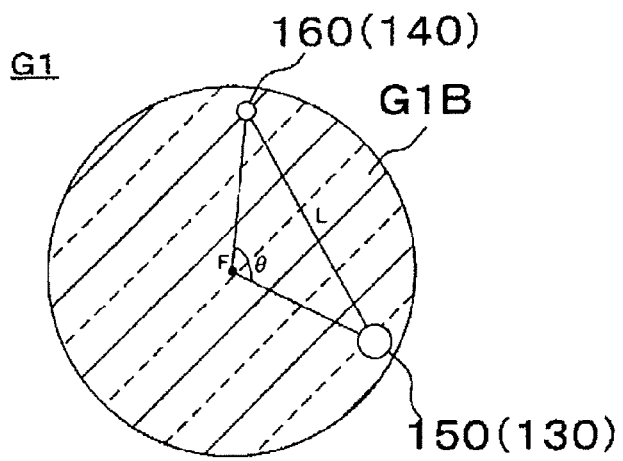
FIG. 2A to FIG. 2C show a glass substrate of the first embodiment of the present invention.
Figure 2B:
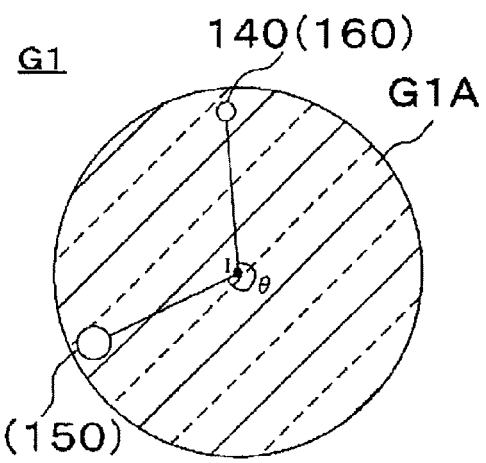
Figure 2C:
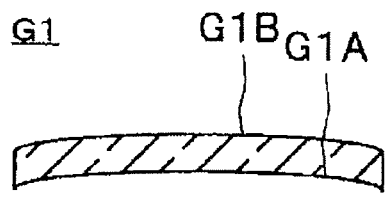

FIG. 2A to FIG. 2C show a glass substrate G1 of the first embodiment of the present invention; FIG. 2A is a top view, FIG. 2B is a bottom view, and FIG. 2C is a cross-sectional view.

The glass substrate G1 of the first embodiment of the present invention is a glass substrate to be laminated with a substrate containing silicon to thereby form a laminated substrate. The glass substrate G1 has a concave surface G1A and a convex surface G1B and having marks which distinguish between the concave surface G1A and the convex surface G1B. Since this glass substrate G1 has marks which distinguish between the concave surface G1A and the convex surface G1B, the concave surface G1A and convex surface G1B of the glass substrate G1 can be distinguished from each other and, hence, in sticking (pasting) the glass substrate G1 to a substrate containing silicon to obtain a laminated substrate, the convex surface G1B of the glass substrate G1 is stuck (pasted) to the substrate containing silicon to thereby render bubble inclusion less apt to occur between the glass substrate G1 and the substrate containing silicon. In case where bubble inclusion has occurred, the substrate containing silicon as a component of the laminated substrate has impaired flatness and has an increased deviation of plate thickness in a step of grinding the substrate containing silicon, rendering a patterning in a subsequent step difficult. In addition, in cases where such a laminated substrate is heated, the glass substrate is prone to be separated from the substrate containing silicon because of the expansion of the bubbles. The glass substrate G1 of the first embodiment of the present invention, when being stuck, is less apt to suffer bubble inclusion between the glass substrate G1 and the substrate containing silicon. Because of this, the substrate containing silicon as a component of the laminated substrate has satisfactory flatness and has a small deviation of plate thickness in the step of grinding the substrate containing silicon, thereby facilitating the patterning in a subsequent step. Furthermore, even when the laminated substrate is heated, the glass substrate and the substrate containing silicon are less apt to separate from each other.

The glass substrate G1 of the first embodiment of the present invention includes two marks 130 and 140 for distinguishing the concave surface G1A and the convex surface G1B from each other, the marks 130 and 140 having been formed on the concave surface G1A and differing in shape from each other, and further includes two marks 150 and 160 for distinguishing the concave surface G1A and the convex surface G1B from each other, the marks 150 and 160 having been formed on the convex surface G1B in positions respectively facing the two marks 130 and 140 formed on the concave surface G1A, the marks 150 and 160 being equal in shape to the respective corresponding marks formed on the concave surface G1A. It is preferable that a shortest line L by which the two marks 150 and 160 on the convex surface G1B are connected to each other on the convex surface G1B should not pass through the center of gravity F on the convex surface G1B. This is for more reliably distinguishing the concave surface G1A and the convex surface G1B, as will be described later. Due to these marks 150, 160, 130, and 140, the concave surface G1A and the convex surface G1B of the glass substrate G1 can be distinguished.

The marks may be, for example, coating materials, or may be recesses formed with a laser or the like. The expression "the glass substrate G1 includes two marks 130 and 140 formed on the concave surface G1A and differing in shape from each other and further includes two marks 150 and 160 formed on the convex surface G1B in positions respectively facing the two marks 130 and 140 formed on the concave surface G1A and are equal in shape to the respective corresponding marks formed on the concave surface G1A" means that the two marks 130 and 140 on the concave surface G1A may have been formed so as to pierce the glass substrate and extend to the convex surface G1B to constitute the two marks 150 and 160 on the convex surface G1B. Examples of such marks include through-holes formed by a laser or the like and cutouts, such as notches and orientation flats (hereinafter referred to also as OFs), which are formed in the edge of the glass substrate G1.

Figure 3A:
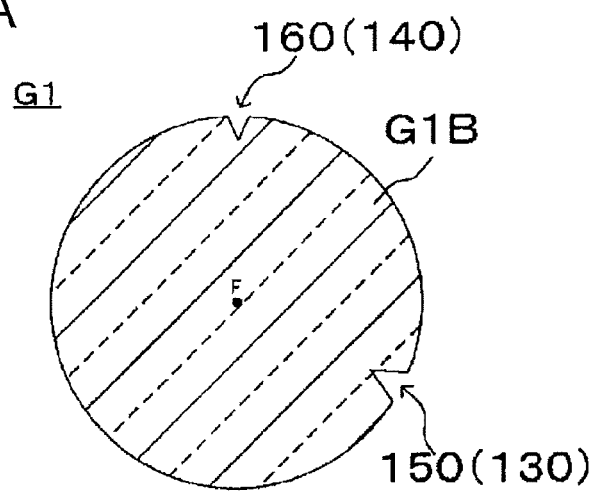
FIG. 3A to FIG. 3C show a glass substrate in which notches are formed as marks.
Figure 3B:
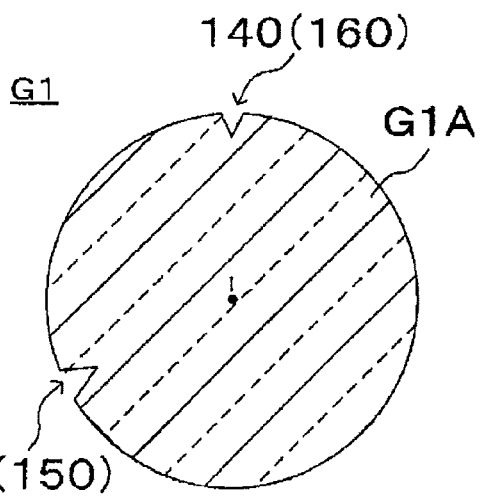
Figure 3C:
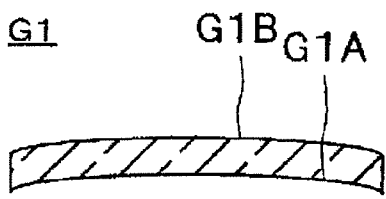

OFs are cutouts in a shape of a circular arc formed by cutting an edge of a glass substrate. Notches are cutouts in a shape of a letter V or U formed in an edge of a glass substrate. FIG. 3A to FIG. 3C show a glass substrate in which notches are formed as marks; FIG. 3A is a top view, FIG. 3B is a bottom view, and FIG. 3C is a cross-sectional view.

The positions of the cutouts in the glass substrate G1 can be detected, for example, with a laser. The cutouts may be detected by taking an image of the glass substrate with a camera and analyzing the image. In cases where the marks are cutouts, the position and angle of the substrate containing silicon 10 can be specified on the basis of the cutouts when forming circuit patterns on the substrate containing silicon 10. Thus, the circuit patterns can be inhibited from suffering a dimensional dislocation.

In cases where the cutouts are notches as in FIG. 3A to FIG. 3C, the glass substrate G1 has a small area loss and is apt to be easily stuck to a substrate containing silicon 10. In cases where the cutouts are OFs, the cutouts can be easily formed and the positions of the cutouts are easy to detect.

It is preferable that the marks should lie within a region ranging from the edge of the glass substrate G1 to 20 mm therefrom. In cases where the marks lie within the region ranging from the edge of the glass substrate G1 to 20 mm therefrom, these marks do not interfere with circuit patterns to be formed on the substrate containing silicon. The positions of the marks are more preferably within a region ranging from the edge of the glass substrate G1 to 10 mm therefrom, even more preferably within a region ranging from the edge of the glass substrate G1 to 5 mm therefrom, especially preferably at the edge of the glass substrate.

It is preferable that the marks should be formed by cutting the edge of the glass substrate G1. Examples of such marks include the notches and OFs described above.

Methods for distinguishing the concave surface G1A and the convex surface G1B from each other are explained here. It is assumed that there are two marks 150 and 160 differing in shape and the mark 150 is larger than the mark 160, for example, as shown in FIG. 2A. It is assumed that the marks 150 and 160 are circular through-holes and that the mark 150 is identical with the mark 130 and the mark 160 is identical with the mark 140.

For example, in FIG. 2A, in which the convex surface G1B is an upper surface, a mark 160 is formed in a region ranging to less than 180° counterclockwise from the mark 150 with respect to the center of gravity F on the convex surface G1B of the glass substrate G1 (a region in FIG. 2A in which θ is less than 180°). In this case, if the mark 160 lies in a region (where θ is less than 180°) ranging to less than 180° counterclockwise from the mark 150 with respect to the center of gravity F on the convex surface G1B of the glass substrate G1, then this surface is found to be a convex surface G1B. If the mark 160 lies in a region (where θ is larger than 180°) ranging to more than 180° counterclockwise from the mark 150 with respect to the center of gravity I of the glass substrate G1, as in FIG. 2B, then this surface is found to be a concave surface G1A.

In case where a mark 160 is formed at a position where θ is 180°, the concave surface G1A cannot be distinguished from the convex surface G1B. In case where a mark 160 is formed at a position where θ is 180°, a shortest line by which the two marks 150 and 160 on the convex surface G1B are connected to each other on the convex surface G1B passes through the center of gravity F on the convex surface G1B.

In the glass substrate G1 of the first embodiment of the present invention, it is preferable that the shortest line by which the two marks 150 and 160 on the convex surface G1B are connected to each other should not pass through the center of gravity F on the convex surface. In cases where marks 150 and 160 are formed in such positions, θ is not 180° and it is possible to distinguish the concave surface G1A and convex surface G1B.

The shortest line by which the two marks 150 and 160 on the convex surface G1B are connected to each other does not pass preferably through a region ranging to 1 mm from the center of gravity F on the convex surface, more preferably through a region ranging to 5 mm therefrom, even more preferably through a region ranging to 10 mm therefrom. The positions of the marks 150 and 160 can be specified, for example, by taking an image of the convex surface G1B of the glass substrate G1 with a camera and analyzing the image.

Figure 4A:
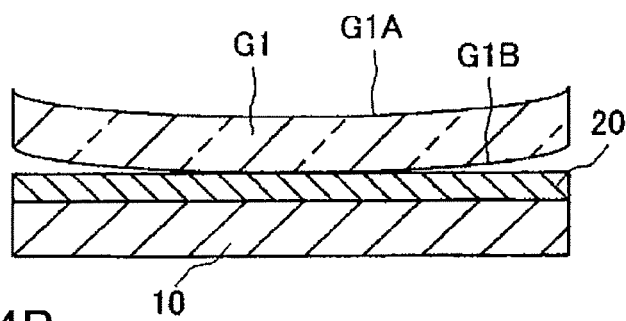
FIG. 4A and FIG. 4B are cross-sectional views which illustrate how a glass substrate of the first embodiment of the present invention is stuck to a substrate containing silicon.
Figure 4B:
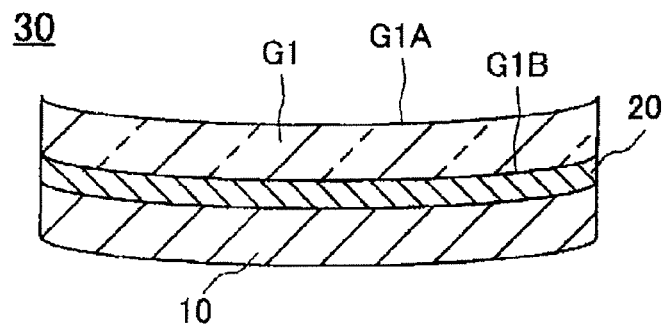

FIG. 4A and FIG. 4B are cross-sectional views which illustrate how a glass substrate of the first embodiment of the present invention is stuck to a substrate containing silicon.

FIG. 4A shows how the glass substrate G1 is stuck to a substrate containing silicon 10, with a resin 20 interposed therebetween, so that the convex surface G1B of the glass substrate G1 is a sticking surface. In cases where the glass substrate G1 is stuck to a substrate containing silicon 10 in this manner, a space is less apt to be formed between the glass substrate G1 and the substrate containing silicon 10 and, hence, bubble inclusion is less apt to occur.

FIG. 4B shows a laminated substrate 30 formed by sticking the convex surface G1B of the glass substrate G1 to the substrate containing silicon 10, with a resin 20 interposed therebetween. The laminated substrate 30 thus formed by sticking the glass substrate G1 to the substrate containing silicon 10 is less apt to have bubbles between the glass substrate G1 and the substrate containing silicon 10. Furthermore, residual stress is less apt to generate in the glass substrate G1 and the substrate containing silicon 10, and the laminated substrate 30 is less apt to suffer cracking or chipping. In addition, stress is less apt to be imposed on the wiring and the wiring is less apt to break.

Figure 5A:
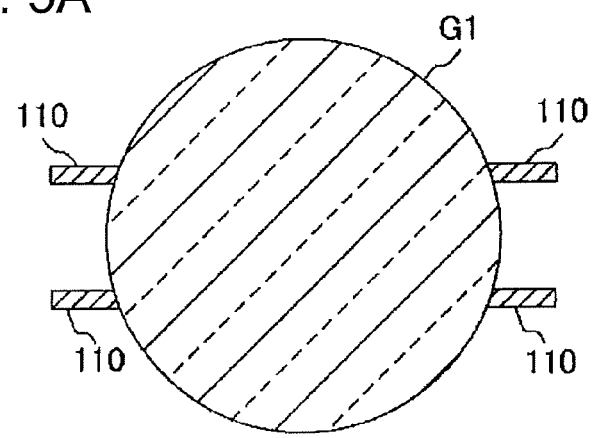
FIG. 5A to FIG. 5C illustrate how a glass substrate of the first embodiment of the present invention is supported by supporting members.
Figure 5B:
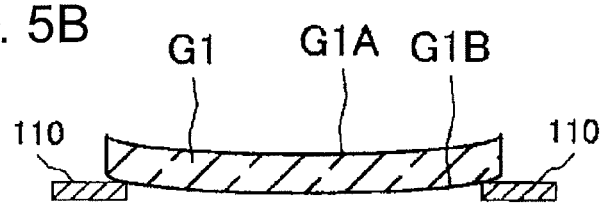
Figure 5C:
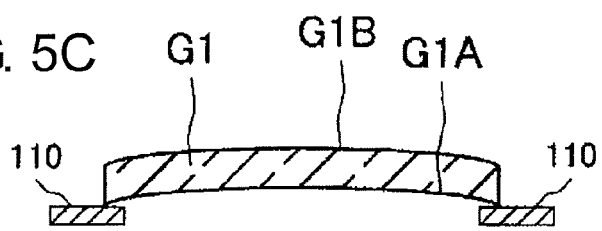
Figure 6A:
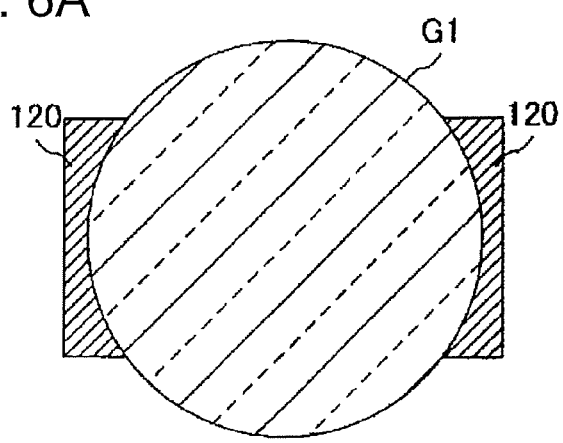
FIG. 6A to FIG. 6C illustrate how a glass substrate of the first embodiment of the present invention is supported by supporting members.
Figure 6B:
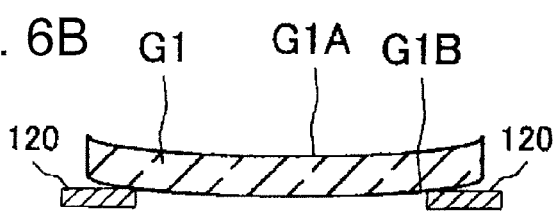
Figure 6C:
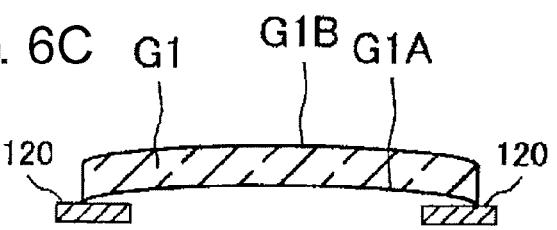

FIG. 5A to FIG. 5C and FIG. 6A to FIG. 6C illustrate how the glass substrate of the first embodiment of the present invention is supported by supporting members. FIG. 5A and FIG. 6A are plan views, and FIG. 5B, FIG. 5C, FIG. 6B, and FIG. 6C are cross-sectional views. FIG. 5B and FIG. 6B are cross-sectional views illustrating a state in which the convex surface G1B is supported, while FIG. 5C and FIG. 6C are cross-sectional views illustrating a state in which the concave surface G1A is supported.

It is preferable that the glass substrate G1 of the first embodiment of the present invention should be supported at four points by supporting members 110 as shown in FIG. 5A. Because of advantages including a reduced contact area, the glass substrate G1, when being stored and transported, can be prevented from suffering surface contamination with dust, etc.

In this case, the glass substrate G1 bends due to its own weight. Because of this, in cases where the glass substrate G1, with the convex surface G1B supported by supporting members 110 as shown in FIG. 5B, is stored and transported, this glass substrate G1 is prone to deform due to the bending. Meanwhile, in cases where the glass substrate G1, with the concave surface G1A supported by supporting members 110 as shown in FIG. 5C, is stored and transported, this glass substrate G1 is less apt to deform. This supporting method is hence preferred.

The glass substrate G1 may be supported at two sides by supporting members 120 as shown in FIG. 6A to FIG. 6C. By supporting the glass substrate G1 at two sides, the glass substrate G1 can be stably stored and transported. Furthermore, the glass substrate G1, when being stored and transported, can be prevented from suffering surface contamination with dust, etc. It is more preferred to support the concave surface G1A of the glass substrate G1 as shown in FIG. 6C, since the glass substrate G1 is less apt to deform.

It is preferable that, in the glass substrate G1 of the first embodiment of the present invention, when the glass substrate G1 has been placed on a horizontal plane so that the concave surface G1A is in contact with the horizontal plane and when a thickness of the glass substrate is expressed by V (unit: mm) and a shortest distance between the center of gravity of the convex surface G1B and the horizontal plane is expressed by U (unit: mm), U/V should be 0.05-50. In cases where U/V is 0.05 or larger, bubble inclusion is made less apt to occur between the glass substrate G1 and the substrate containing silicon in sticking the glass substrate G1 to a substrate containing silicon to obtain a laminated substrate, by sticking the convex surface G1B of the glass substrate G1 to the substrate containing silicon. U/V is more preferably 1 or larger, even more preferably 5 or larger. In cases where U/V is 50 or less, this glass substrate G1 can be easily stuck to a substrate containing silicon. U/V is more preferably 30 or less, even more preferably 10 or less.

Next, glass substrates according to a second embodiment of the present invention are explained.

Figure 7A:
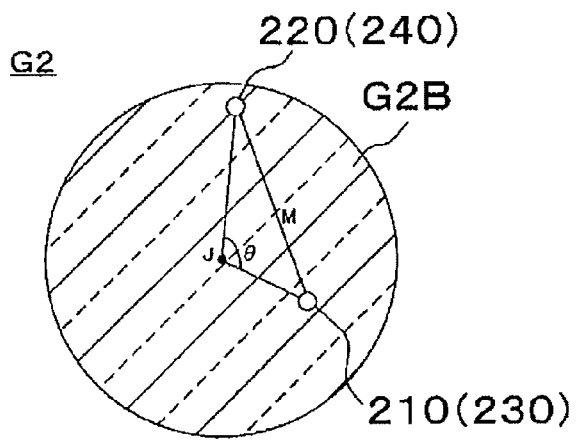
FIG. 7A to FIG. 7C show a glass substrate of a second embodiment of the present invention.
Figure 7B:
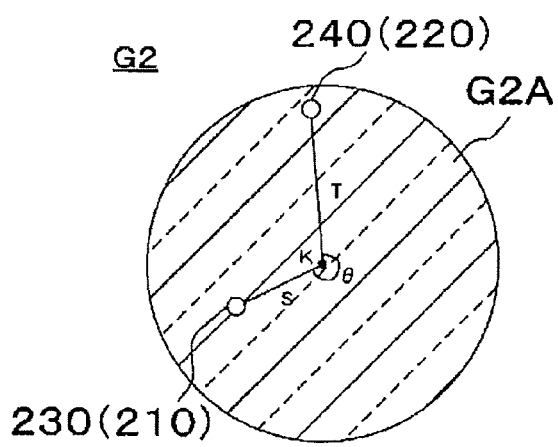
Figure 7C:
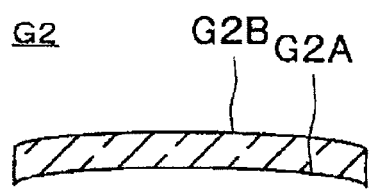

FIG. 7A to FIG. 7C show a glass substrate G2 of the second embodiment of the present invention; FIG. 7A is a top view, FIG. 7B is a bottom view, and FIG. 7C is a cross-sectional view.

In the glass substrate G2 of the second embodiment of the present invention, the marks which distinguish between the concave surface G2A and convex surface G2B thereof include: two marks 230 and 240 formed on the concave surface G2A and differing from each other in distance from the center of gravity on the concave surface G2A; and two marks 210 and 220 which are formed on the convex surface G2B in positions respectively facing the two marks 230 and 240 formed on the concave surface G2A and which are equal in shape to the respective corresponding marks 230 and 240 formed on the concave surface G2A. It is preferable that a shortest line M by which the two marks 210 and 220 on the convex surface G2B are connected to each other on the convex surface G2B should not pass through the center of gravity J on the convex surface G2B. In cases where this requirement is satisfied, the concave surface G2A and convex surface G2B of the glass substrate G2 can be distinguished more reliably by the marks 210, 220, 230, and 240.

Methods for distinguishing the concave surface G2A and the convex surface G2B from each other are explained here. It is assumed that there are two marks 230 and 240 on the concave surface G2A of the glass substrate G2 and that the two marks 230 and 240 respectively have different distances S and T from the center of gravity K on the concave surface G2A, the mark 230 being closer to the center of gravity K than the mark 240, as shown, for example, in FIG. 7A and FIG. 7B. It is further assumed that the marks 210 and 220 are circular through-holes and that the mark 210 is identical with the mark 230 and the mark 220 is identical with the mark 240.

In FIG. 7A, in which the convex surface G2B is an upper surface, a mark 220 is formed in a region ranging to less than 180° counterclockwise from the mark 210 with respect to the center of gravity J of the glass substrate G2 (A in FIG. 7A is less than 180°). Thus, if the mark 220 lies in a region (where θ is less than 180°) ranging to less than 180° counterclockwise from the mark 210 with respect to the center of gravity J of the glass substrate G2, then this surface is found to be a convex surface G2B. If the mark 220 lies in a region (where θ is larger than 180°) ranging to more than 180° counterclockwise from the mark 210 with respect to the center of gravity K of the glass substrate G2, as in FIG. 7B, then this surface is found to be a concave surface G2A.

In case where a mark 220 is formed at a position where θ is 180°, the concave surface G2A cannot be distinguished from the convex surface G2B. In this case, a shortest line by which the two marks 210 and 220 on the convex surface G2B are connected to each other passes through the center of gravity J on the convex surface G2B.

In the glass substrate G2 of the second embodiment of the present invention, the shortest line by which the two marks 210 and 220 on the convex surface G2B are connected to each other on the convex surface G2B does not pass through the center of gravity J on the convex surface. In cases where marks 210 and 220 are formed in such positions, it is possible to distinguish the concave surface G2A from the convex surface G2B.

The shortest line by which the two marks 210 and 220 on the convex surface G2B are connected to each other on the convex surface G2B does not pass preferably through a region ranging to 1 mm from the center of gravity J on the convex surface, more preferably through a region ranging to 5 mm therefrom, even more preferably through a region ranging to 10 mm therefrom. The positions of the marks 210 and 220 can be specified, for example, by taking an image of the convex surface G2B of the glass substrate G2 with a camera and analyzing the image.

Next, glass substrates according to a third embodiment of the present invention are explained.

Figure 8A:
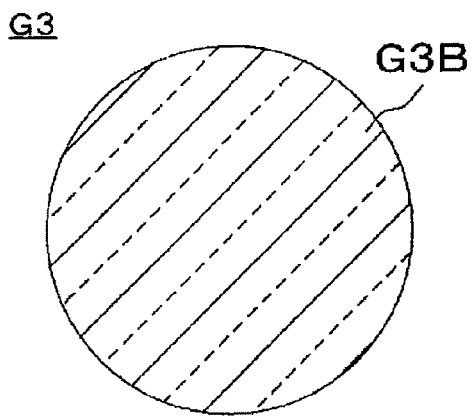
FIG. 8A to FIG. 8C show a glass substrate of a third embodiment of the present invention.
Figure 8B:
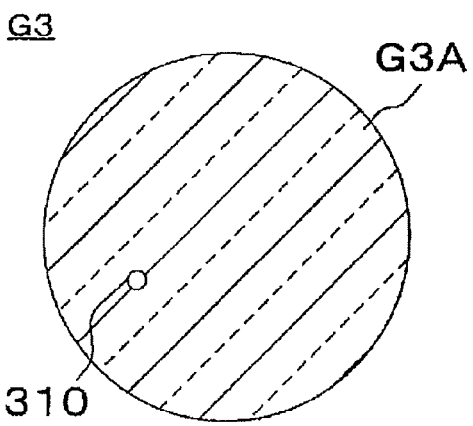
Figure 8C:
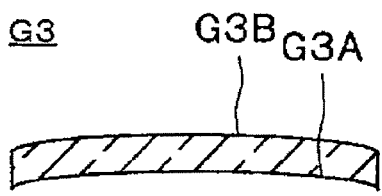
Figure 9A:
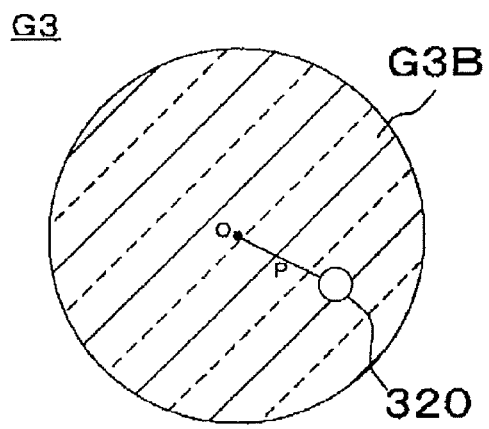
FIG. 9A to FIG. 9C show a glass substrate of the third embodiment of the present invention.
Figure 9B:
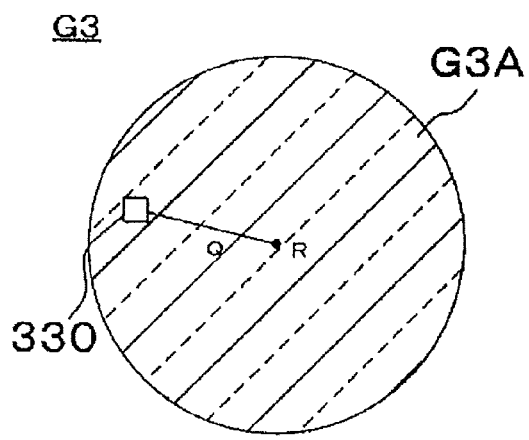
Figure 9C:
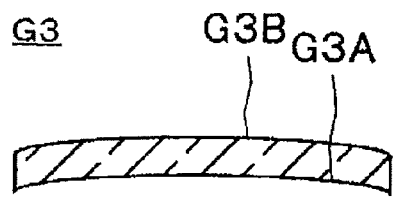

FIG. 8A to FIG. 8C and FIG. 9A to FIG. 9C show glass substrates G3 of the third embodiment of the present invention; FIG. 8A and FIG. 9A are top views, FIG. 8B and FIG. 9B are bottom views, and FIG. 8C and FIG. 9C are cross-sectional views.

A glass substrate G3 of the third embodiment of the present invention is one in which one or more marks that distinguish between the concave surface G3A and the convex surface G3B are marks formed on at least one of the concave surface G3A and the convex surface G3B. It is preferable that the marks on the concave surface G3A and the marks on the convex surface G3B have at least one difference selected from the group consisting of number, shape, and distance from the center of gravity.

In FIG. 8A to FIG. 8C, the concave surface G3A and the convex surface G3B differ from each other in the number of marks formed thereon. The expression "differ in the number of marks" includes the case where either the concave surface G3A or the convex surface G3B has no mark. FIG. 8A to FIG. 8C show a glass substrate in which the concave surface G3A has a mark 310 formed thereon and the convex surface G3B has no mark. In cases where marks are formed so that the concave surface G3A and the convex surface G3B differ from each other in the number of marks formed thereon, there is an advantage in that so long as how many marks are to be formed on each of the concave surface G3A and the convex surface G3B is decided beforehand, the concave surface G3A and the convex surface G3B can be distinguished from each other by counting the marks formed on the concave surface G3A and the marks formed on the convex surface G3B.

In FIG. 9A to FIG. 9C, the mark 330 formed on the concave surface G3A and the mark 320 formed on the convex surface G3B differ from each other in shape and in distance Q or P from the center of gravity R or O. In cases where the mark 330 on the concave surface G3A and the mark 320 on the convex surface G3B are formed so as to differ in shape, there is an advantage in that so long as what shape the mark to be formed on each of the concave surface G3A and convex surface G3B has is decided beforehand, the concave surface G3A and the convex surface G3B can be distinguished from each other by determining the shape of the mark formed on the concave surface G3A and the shape of the mark formed on the convex surface G3B. In the case where at least one of the concave surface G3A and the convex surface G3B has two or more marks, these marks may be ones in which at least one of all the marks differs in shape from the other marks.

Furthermore, in cases where the mark 330 on the concave surface G3A and the mark 320 on the convex surface G3B are formed so as to differ in distance Q or P from the center of gravity R or O, there is an advantage in that so long as where the mark is formed on each of the concave surface G3A and convex surface G3B is decided beforehand, the concave surface G3A and the convex surface G3B can be distinguished from each other by measuring the distances Q and P from the centers of gravity R and O to the mark 330 formed on the concave surface G3A and the mark 320 formed on the convex surface G3B. In the case where at least one of the concave surface G3A and the convex surface G3B has two or more marks, these marks may be ones in which at least one of all the marks differs from the other marks in distance to the center of gravity.

In the glass substrate according to this embodiment explained above, the concave surface and convex surface of the glass substrate can be distinguished from each other. Sticking (pasting) the glass substrate to a substrate containing silicon can hence be performed so that the convex surface of the glass substrate is recognized and stuck (pasted) to the substrate containing silicon. Consequently, bubble inclusion is less apt to occur between the glass substrate and the substrate containing silicon.

It is preferable that a glass substrate of one embodiment of the present invention should have a depression as at least one of the marks. In cases where a mark is constituted of a depression, the position of the mark can be easily detected, and which main surface of the glass substrate is the convex surface can be easily determined. Depressions can be formed, for example, with a laser. The depressions are not limited in shape, size, or number. The depressions may have any shape such as, for example, a circle, ellipse, or polygon, or may be letters or symbols.

In the case where a glass substrate of one embodiment of the present invention has a depression as a mark, it is preferable that the depression should have a depth of 1-50 µm. In cases where the depth of the depression is 1 µm or larger, this depression is easy to detect. The depth of the depression is more preferably 3 µm or larger, even more preferably 4 µm or larger. In cases where the depth of the depression is 50 µm or less, the glass substrate is less apt to crack. The depth of the depression is more preferably 20 µm or less, even more preferably 10 µm or less.

The symbol "-" used above for indicating a numerical range means that numerical values that precede and succeed the symbol are included in the range as a lower limit and an upper limit. Unless otherwise indicated, "-" has the same meaning in this description.

It is preferable that one main surface of a glass substrate of one embodiment of the present invention should have an area of 70-2,000 cm². In cases where the glass substrate has an area of 70 cm² or larger, a substrate containing silicon which includes a large number of silicon elements can be disposed and an improvement in production efficiency is attained in a step of laminating the glass substrate with a substrate containing silicon. The area of the one main surface of the glass substrate is more preferably 80 cm² or larger, even more preferably 170 cm² or larger, especially preferably 300 cm² or larger, most preferably 700 cm² or larger. In cases where the area of the one main surface of the glass substrate is 2,000 cm² or less, this glass substrate is easy to handle and can be inhibited from being damaged by contact with the substrate containing silicon or with peripheral members, etc. The area of the one main surface is more preferably 1,700 cm² or less, even more preferably 1,000 cm² or less, especially preferably 800 cm² or less, most preferably 750 cm² or less.

It is preferable that a glass substrate of one embodiment of the present invention should be circular. In cases where the glass substrate is circular, it is easy to laminate this glass substrate with a substrate containing silicon. In particular, laminating with a circular substrate containing silicon is easy. The term "circular" means a shape that is not limited to a complete circle and that may be a circle in which the dimensional deviations from a complete circle having the same diameter are up to 50 μm.

In the case where a glass substrate of one embodiment of the present invention is circular, it is preferable that a diameter thereof should be 7 cm or larger. In cases where the diameter thereof is 7 cm or larger, a substrate containing silicon which includes a large number of silicon elements can be disposed. Furthermore, a large number of semiconductor elements can be obtained from the laminated substrate formed by sticking the glass substrate having a diameter of 7 cm or larger to the substrate containing silicon, resulting in an improvement in production efficiency. The diameter thereof is more preferably 10 cm or larger, even more preferably 15 cm or larger, especially preferably 20 cm or larger, most preferably 25 cm or larger.

It is preferable that the diameter thereof should be 50 cm or less. In cases where the diameter thereof is 50 cm or less, this glass substrate is easy to handle and can be inhibited from being damaged by contact with the substrate containing silicon or with peripheral members, etc. The diameter thereof is more preferably 45 cm or less, even more preferably 40 cm or less, especially preferably 35 cm or less.

The shape of a glass substrate of one embodiment of the present invention is not limited to a circular shape and may be rectangular. In the case of a circular shape, a part of a periphery thereof may be straight. In cases where the glass substrate is rectangular, a larger number of semiconductor elements can be obtained from the laminated substrate formed by sticking this glass substrate to a substrate containing silicon, as compared with the case of a circular glass substrate having the same area, resulting in an improvement in production efficiency.

It is preferable that a glass substrate of one embodiment of the present invention should have a thickness of 2.0 mm or less. In cases where the thickness thereof is 2.0 mm or less, the laminated substrate obtained by sticking this glass substrate to a substrate containing silicon can have a reduced thickness. The thickness of the glass substrate is more preferably 1.5 mm or less, even more preferably 1.0 mm or less, especially preferably 0.8 mm or less.

It is preferable that the thickness thereof should be 0.1 mm or larger. In cases where the thickness thereof is 0.1 mm or larger, this glass substrate can be inhibited from being damaged by contact with the substrate containing silicon or with peripheral members, etc. Furthermore, this glass substrate can be inhibited from bending due to its own weight. The thickness thereof is more preferably 0.2 mm or larger, even more preferably 0.3 mm or larger.

It is preferable that a glass substrate of one embodiment of the present invention should have a deviation of plate thickness of 15 μm or less. The deviation of plate thickness is calculated through a thickness measurement with, for example, a laser displacement meter. In cases where the deviation of plate thickness is 15 μm or less, a sticking surface to a substrate containing silicon has satisfactory conformability, making it easy to laminate this glass substrate with the substrate containing silicon. The deviation of plate thickness is more preferably 12 μm or less, even more preferably 10 μm or less, especially preferably 5 μm or less.

It is preferable that a glass substrate of one embodiment of the present invention should have a Young's modulus of 65 GPa or higher. The Young's modulus is measured, for example, by an ultrasonic pulse method. In cases where the Young's modulus thereof is 65 GPa or higher, the glass substrate warpage or cracking which may occur in the slow cooling step performed when producing the glass substrate can be inhibited.

Furthermore, this glass substrate can be inhibited from being damaged by contact with the substrate containing silicon, etc. The Young's modulus thereof is more preferably 70 GPa or higher, even more preferably 75 GPa or higher, especially preferably 80 GPa or higher.

It is preferable that the Young's modulus thereof should be 100 GPa or less. In cases where the Young's modulus thereof is 100 GPa or less, this glass can be inhibited from being brittle and the glass substrate can be inhibited from chipping when being processed by cutting or dicing. The Young's modulus thereof is more preferably 90 GPa or less, even more preferably 87 GPa or less.

It is preferable that a glass substrate of one embodiment of the present invention should have an average coefficient of thermal expansion at 50° C.-350° C. of 30-140 ($\times 10^{-7}$/° C.). A heat treatment step is necessary for sticking a substrate containing silicon to the glass substrate.

In the heat treatment step, for example, the substrate containing silicon and the glass substrate are stuck to each other at a temperature of 200° C.-400° C., and the resultant laminated substrate is cooled to room temperature. In case where there is a difference in the coefficient of thermal expansion between the glass substrate and the substrate containing silicon, the difference in the coefficient of thermal expansion is causative of the generation of a large residual strain (residual deformation) in the substrate containing silicon.

In cases where the average coefficient of thermal expansion at 50° C.-350° C. is 30-140 ($\times 10^{-7}$/° C.), the residual strain which generates in the substrate containing silicon in the heat treatment step for sticking the substrate containing silicon to the glass substrate is small.

The average coefficient of thermal expansion at 50° C.-350° C. is determined through a measurement of thermal expansion coefficient made in the temperature range of 50° C.-350° C. by the method as provided for in JIS R3102 (year 1995).

In the case where a glass substrate of one embodiment of the present invention is used as a fan-out type wafer-level package, a substrate containing silicon is laminated over the glass substrate and a resin is formed so as to be in contact with both the glass substrate and the substrate containing silicon. In cases where the glass substrate has an average coefficient of thermal expansion at 50° C.-350° C. of 30-50 ($\times 10^{-7}$° C.), the residual strain which generates in the substrate containing silicon in the heat treatment step is small.

The average coefficient of thermal expansion at 50° C.-350° C. may be 31-50 ($\times 10^{-7}$° C.), or may be 32-40 ($\times 10^{-7}$° C.), or may be 32-36 ($\times 10^{-7}$° C.), or may be 34-36 ($\times 10^{-7}$° C.).

Meanwhile, in cases where the average coefficient of thermal expansion at 50° C.-350° C. is 50-80 ($\times 10^{-7}$° C.), the residual strain which generates in the substrate containing silicon and the resin in the heat treatment step is small.

The average coefficient of thermal expansion at 50° C.-350° C. may be 60-75 ($\times 10^{-7}$° C.), or may be 67-72 ($\times 10^{-7}$° C.).

Meanwhile, in cases where the average coefficient of thermal expansion at 50° C.-350° C. is 80-120 ($\times 10^{-7}$° C.), the residual strain which generates in the resin and the wiring is small. The average coefficient of thermal expansion at 50° C.-350° C. may be 85-100 ($\times 10^{-7}$° C.), or may be 90-95 ($\times 10^{-7}$° C.).

In cases where the average coefficient of thermal expansion at 50° C.-350° C. is 120-140 ($\times 10^{-7}$° C.), the residual strain which generates in the substrates of fan-out type wafer-level packages that have a high resin proportion and a high average coefficient of thermal expansion is small.

The average coefficient of thermal expansion at 50° C.-350° C. may be 120-135 ($\times 10^{-7}$° C.), or may be 125-130 ($\times 10^{-7}$° C.).

It is preferable that a glass substrate of one embodiment of the present invention should include a light-shielding film formed on at least one of the concave surface and convex surface of the glass substrate. In cases where the glass substrate includes a light-shielding film formed on at least one of the concave surface and convex surface thereof, it is easy to detect the position of the glass substrate or laminated substrate in the inspection step of the glass substrate or laminated substrate. The position thereof is specified on the basis of reflected light caused by irradiating the glass substrate or the laminated substrate with light. Glass substrates are prone to transmit light. By forming a light-shielding film on a main surface of the glass substrate, the reflected light is intensified to facilitate the detection of the position. It is preferable that the light-shielding film should include Ti.

It is preferable that a glass substrate of one embodiment of the present invention should contain 0-0.1% of an alkali metal oxide, as represented by mole percentage based on oxides. Examples of the alkali metal oxides include $Li_2O$, $Na_2O$, and $K_2O$. In cases where the content of alkali metal oxides is 0.1% or less as represented by mole percentage based on oxides, alkali ions are less apt to diffuse in the substrate containing silicon in the heat treatment step in which the silicon substrate is stuck to the glass substrate.

The content of alkali metal oxides as represented by mole percentage based on oxides is more preferably 0.05% or less, even more preferably 0.02% or less. It is especially preferable that the glass substrate should contain substantially no alkali metal oxides. The expression "contain substantially no alkali metal oxides" means that the glass substrate contains completely no alkali metal oxides or that the glass substrate may contain alkali metal oxides as impurities which have come thereinto unavoidably because of the production process.

It is preferable that a glass substrate of one embodiment of the present invention should have a density of 2.60 g/cm$^3$ or less. In cases where the density thereof is 2.60 g/cm$^3$ or less, this glass substrate is lightweight. This glass substrate is less apt to suffer bending due to its own weight. The density thereof is more preferably 2.55 g/cm$^3$ or less, even more preferably 2.50 g/cm$^3$ or less.

It is preferable that the density thereof should be 2.20 g/cm$^3$ or higher. In cases where the density thereof is 2.20 g/cm$^3$ or higher, this glass has an increased Vickers hardness and the glass surfaces are less apt to receive scratches. The density thereof is more preferably 2.30 g/cm$^3$ or higher, even more preferably 2.40 g/cm$^3$ or higher, especially preferably 2.45 g/cm$^3$ or higher.

It is preferable that a glass substrate of one embodiment of the present invention should have a transmittance at wavelength of 250 nm of 10% or higher. By irradiating the resin with ultraviolet light through the glass substrate, the glass substrate is removed from the laminated substrate. In cases where the glass substrate has a transmittance at wavelength of 250 nm of 10% or higher, the resin is irradiated with a larger amount of ultraviolet light, easily rendering the glass substrate removable from the laminated substrate. The transmittance at wavelength of 250 nm is more preferably 15% or higher, even more preferably 20% or higher.

It is preferable that a glass substrate of one embodiment of the present invention should have a transmittance at wavelength of 300 nm of 45% or higher. In cases where the glass substrate has a transmittance at wavelength of 300 nm of 45% or higher, the resin is irradiated with a larger amount of ultraviolet light, easily rendering the glass substrate removable from the laminated substrate. The transmittance at wavelength of 300 nm is more preferably 50% or higher, even more preferably 55% or higher, especially preferably 60% or higher.

It is preferable that a glass substrate of one embodiment of the present invention should have a transmittance at wavelength of 350 nm of 45% or higher. In cases where the glass substrate has a transmittance at wavelength of 350 nm of 45% or higher, the resin is irradiated with a larger amount of ultraviolet light, easily rendering the glass substrate removable from the laminated substrate. The transmittance at wavelength of 350 nm is more preferably 50% or higher, even more preferably 55% or higher, especially preferably 60% or higher.

It is preferable that a glass substrate of one embodiment of the present invention should be one in which an amount of defects having a major-axis length of 200 μm or larger, such as bubbles and foreign matter, is 10 pcs/cm$^2$ or less. In cases where the amount of defects having a major-axis length of 200 μm or larger therein is 10 pcs/cm$^2$ or less, the light used for irradiation in the sticking step is less blocked and the sticking is easy. The amount of defects having a major-axis length of 200 μm or larger therein is more preferably 2 pcs/cm$^2$ or less. It is especially preferable that the glass substrate should contain no defects having a major-axis length of 200 μm or larger.

It is preferable that a glass substrate of one embodiment of the present invention should be used in such a manner that the convex surface of the glass substrate is stuck to a substrate containing silicon to thereby form a laminated substrate. In cases where a laminated substrate is formed in this manner, bubble inclusion is less apt to occur between the glass substrate and the substrate containing silicon in sticking the glass substrate to the substrate containing silicon. In cases where the laminated substrate is stored and transported so that the concave surface of the glass substrate is supported by supporting members, the laminated substrate is less apt to deform.

The supporting members are not limited to a fixed type, and may be of a movable type. By supporting the glass substrate and the laminated substrate by movable fixing members, the glass substrate and the laminated substrate can be transported without contaminating the surfaces of the glass substrate and laminated substrate. Furthermore, by supporting the concave surfaces of the glass substrate and laminated substrate by movable supporting members, the glass substrate or the laminated substrate can be transported while inhibiting the deformation thereof.

Next, a laminated substrate according to one embodiment of the present invention is explained.

The laminated substrate of one embodiment of the present invention is formed by sticking (pasting) the convex surface of the glass substrate to a substrate containing silicon. Since this laminated substrate is formed by sticking (pasting) the convex surface of the glass substrate to a substrate containing silicon, bubble inclusion is less apt to occur between the glass substrate and the substrate containing silicon.

Subsequently, a laminated substrate according to another embodiment of the present invention is explained.

The laminated substrate of another embodiment of the present invention is a laminated substrate in which a curved surface constituted of the convex surface or concave surface of the glass substrate and a curved surface constituted of a convex surface or concave surface of a substrate containing silicon are stuck (pasted) to each other so as to conform to each other. The expression "conform to each other" means that the curved surface of the glass substrate and the curved surface of the substrate containing silicon face in the same direction, that is, the two substrates are equal in warpage direction.

Figure 12A:
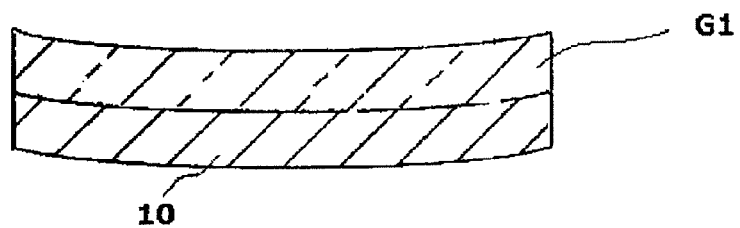
FIG. 12A and FIG. 12B are cross-sectional views for illustrating relationships between a curved surface of a glass substrate and a curved surface of a substrate containing silicon in a step for producing a laminated substrate.
Figure 12B:
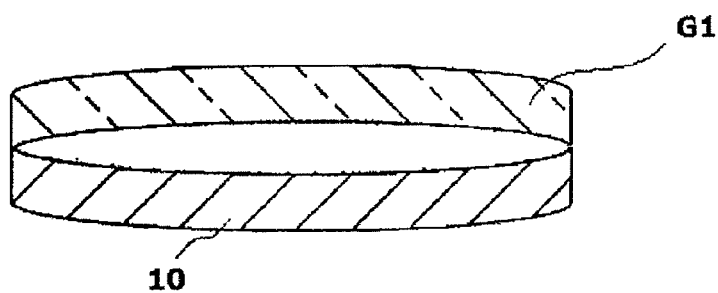

FIG. 12A and FIG. 12B is cross-sectional views for illustrating relationships between a curved surface of a glass substrate and a curved surface of a substrate containing silicon in a step for producing a laminated substrate.

In the embodiment shown in FIG. 12A, the curved surface constituted of the convex surface of a glass substrate G1 and the curved surface constituted of the concave surface of a substrate containing silicon 10 are stuck to each other so as to conform to each other. It is hence possible to attain a reduction in the unevenness of adhesion between the glass substrate G1 and the substrate containing silicon 10, an improvement in bubble elimination during the sticking, a reduction in the degree of overall warpage, a reduction in interlaminar residual stress, and an even distribution of interfacial residual stress in the cured laminated substrate, resulting in improvements in yield and reliability. In addition, not only a decrease in yield due to, for example, an interfacial separation failure in a later step can be prevented but also chip products produced through a dicing process in a final step have improved reliability.

In contrast, FIG. 12B shows a configuration in which a glass substrate G1 and a substrate containing silicon 10 are stuck to each other so that the concave surfaces thereof face each other. In this configuration, the laminated substrate has an uneven distribution of interfacial residual stress, and portions having high residual stress are locally and scatteringly present therein. Such unevenness not only undesirably induces a separation failure but also results in unevenness in reliability among the chip products.

It is hence preferable that a process for producing a laminated substrate of the present invention should include sticking a curved surface constituted of the convex surface or concave surface of a glass substrate G1 to a curved surface constituted of the convex surface or concave surface of a substrate containing silicon 10 so that the curved surfaces of the two substrates conform to each other.

In the laminated substrate of the present invention, a difference in warpage between the glass substrate G1 and the substrate containing silicon 10, i.e., a maximum dimension, along a direction perpendicular to a substrate plane directions, of any space formed between the glass substrate G1 and the substrate containing silicon 10 which have been laminated, is preferably 0-400 µm, more preferably 0-100 µm. So long as the warpage difference is within that range, the effects shown above can be satisfactorily produced.

In the laminated substrate of the present invention, it is preferable that the glass substrate G1 should be one formed by a float process. Glass substrates formed by the float process are apt to have a warped shape which is a bowl shape symmetrical with respect to the center, and are apt to be even in conformation direction during sticking, as compared with glass substrates formed by a fusion process, which is prone to result in random warped shapes, e.g., a saddle shape. Use of a glass substrate formed by the float process is hence apt to contribute to quality stabilization. In the case where a glass substrate formed by the fusion process is deemed to be "free from waviness" in accordance with the SEMI standards as described above, this glass substrate can be satisfactorily used.

It is more preferable that the process for producing a laminated substrate of the present invention should include predicting the shape of the curved surface of the substrate containing silicon beforehand, and sticking this curved surface and the curved surface of the glass substrate to each other so that the predicted shape of the curved surface and the shape of the curved surface of the glass substrate conform to each other. For example, in the production of a fan-out type wafer-level package or the like, the package is a hybrid including a substrate containing silicon and another material, e.g., a resin, and the direction of warpage is frequently determined, depending on products, as the production process proceeds. Consequently, in cases where what warped shape the substrate containing silicon forms in a production process is predicted beforehand and the substrate containing silicon and the glass substrate are stuck to each other so that the predicted warped shape and the warped shape of the glass substrate conform to each other, then the residual stress remaining at the sticking interface after the production process can be made even or be reduced.

It is preferable that a laminated substrate of one embodiment of the present invention should have a thickness of 0.5-3 mm. In cases where the thickness thereof is 0.5 mm or larger, this laminated substrate has increased strength and can be inhibited from being damaged by contact with peripheral members, etc. The thickness thereof is more preferably 1.0 mm or larger, even more preferably 1.3 mm or larger. In cases where the thickness thereof is 3 mm or less, this laminated substrate can be thin. The thickness thereof is more preferably 2.5 mm or less, even more preferably 2.0 mm or less.

In a laminated substrate of one embodiment of the present invention, the substrate containing silicon may have a cutout formed therein. In cases where the substrate containing silicon has a cutout, the position and angle of the substrate containing silicon can be specified on the basis of the cutout when forming circuit patterns on the substrate containing silicon. Thus, the circuit patterns can be inhibited from suffering a dimensional dislocation. The position of the cutout in the substrate containing silicon can be detected, for example, with a laser. The cutout may be detected by taking an image of the glass substrate with a camera and analyzing the image.

It is preferable that a laminated substrate of one embodiment of the present invention should be one in which the glass substrate and the substrate containing silicon each have cutouts and which has been formed by sticking the glass substrate to the substrate containing silicon so that the cutout of the glass substrate and the cutout of the substrate containing silicon lie in the same position. In cases where the laminated substrate has been thus formed, it is easy to detect the position of the cutout of the substrate containing silicon and to inhibit circuit patterns from suffering a dimensional dislocation.

For example, the cutouts can be detected by irradiating either the substrate containing silicon or the glass substrate with a laser. In cases where the cutouts are notches, the glass substrate and the silicon substrate have a small area loss, and the glass substrate and the substrate containing silicon are apt to be easily stuck to each other. Furthermore, since the substrate containing silicon has a small area loss, a large number of circuits can be formed on the substrate containing silicon. In cases where the cutouts are OFs, the cutouts can be easily formed and the positions of the cutouts are easy to detect.

A laminated substrate of one embodiment of the present invention may be one formed by sticking the concave surface of the glass substrate as a component of one laminated substrate to the substrate containing silicon as a component of another laminated substrate. Two laminated substrates may have been stuck to each other, or three laminated substrates may have been stuck together, or four laminated substrates may have been stuck together. The laminated substrate thus formed is less apt to have residual stress and to suffer cracking or chipping.

It is preferable that a laminated substrate of one embodiment of the present invention should be supported by supporting the concave surface of the glass substrate at four points by supporting members. In cases where the concave surface of the glass substrate is supported at four points by supporting members, the surface of the glass substrate or laminated substrate is less apt to be contaminated with dust, etc.

A laminated substrate of one embodiment of the present invention may be supported by supporting the concave surface of the glass substrate at two sides by supporting members. In cases where the concave surface of the glass substrate is supported at two sides by supporting members, the laminated substrate can be stably stored and transported. Furthermore, the surface of the laminated substrate is less apt to be contaminated with dust, etc.

Next, laminates according to embodiments of the present invention are explained.

A laminate of one embodiment of the present invention is characterized by being formed by sticking (pasting) another glass substrate to the glass substrate which is a component of the laminated substrate. In the case where a laminated substrate of one embodiment of the present invention is used as a support glass for semiconductor back grinding, it is necessary, for regulating the thickness of the glass substrate, to grind the glass substrate since this glass substrate is the only one glass substrate contained as a component of the laminated substrate.

Since the laminate of one embodiment of the present invention has been formed by sticking another glass substrate to the glass substrate which is a component of the laminated substrate, thickness regulation can be attained, without necessitating grinding of the glass substrate, by removing the other glass substrate. Meanwhile, a glass substrate having any thickness has a deflection amount larger than the deflection amount of a laminated substrate obtained by sticking two glass substrates each having a thickness one-half the thickness of said glass substrate. By regulating the thickness of each glass substrate and the number of glass substrates to be laminated together, the deflection amount of the laminated substrate can be regulated.

Next, packages according to embodiments of the present invention are explained.

Figure 10:
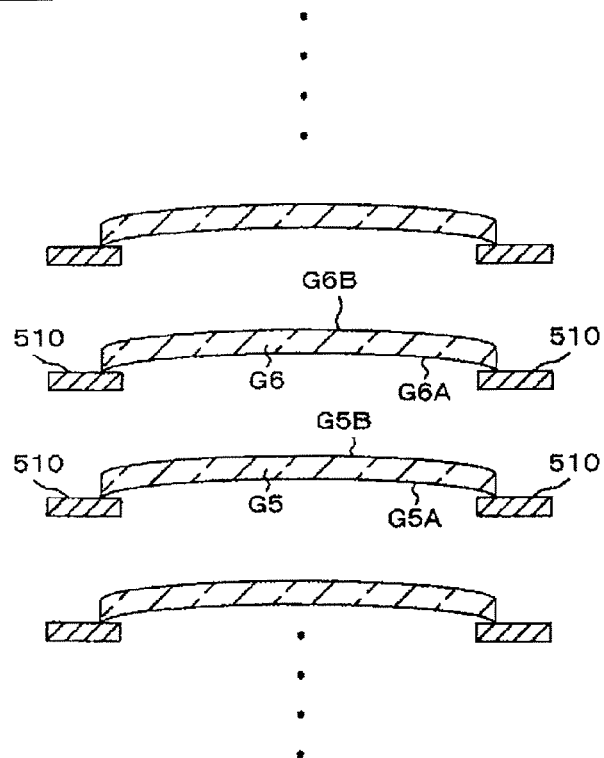
FIG. 10 is a cross-sectional view of a package according to one embodiment of the present invention.

FIG. 10 is a cross-sectional view of a package 500 according to one embodiment of the present invention. The package 500 of one embodiment of the present invention is formed by packaging two or more glass substrates which each are the glass substrate described above, so that the convex surface G5B of one glass substrate G5 of these glass substrates faces the concave surface G6A of another glass substrate G6.

Figure 11:
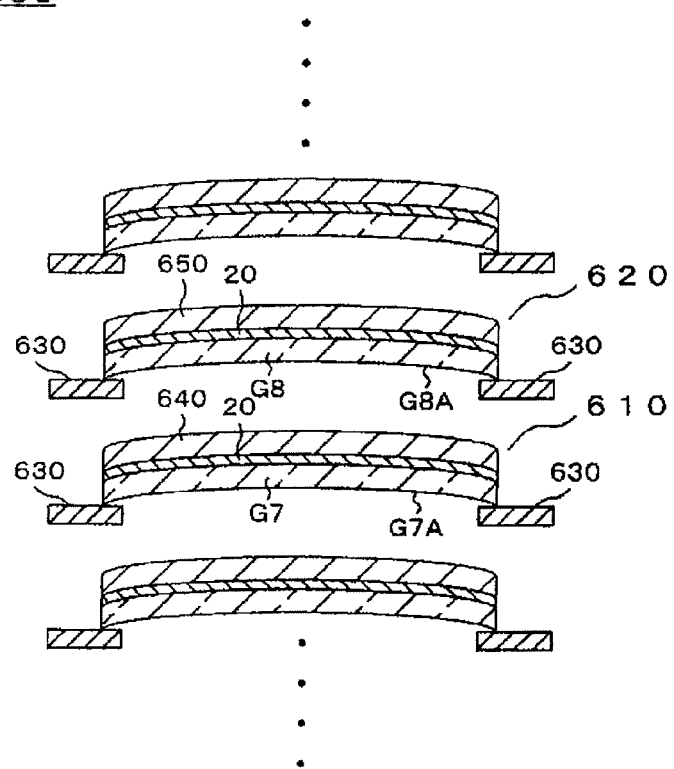
FIG. 11 is a cross-sectional view of a package according to one embodiment of the present invention.

FIG. 11 is a cross-sectional view of a package 600 according to one embodiment of the present invention. The package 600 of one embodiment of the present invention is formed by packaging two or more laminated substrates which each are the laminated substrate described above, so that the substrate containing silicon 640 which is a component of one laminated substrate 610 of these laminated substrates faces the concave surface G8A of the glass substrate G8 which is a component of another laminated substrate 620.

A package according to one embodiment of the present invention is formed by packaging two or more laminates which each are the laminate described above, so that the substrate containing silicon as a component of one of these laminates faces the concave surface of the glass substrate as a component of another laminate.

In a package according to one embodiment of the present invention, the number of the glass substrates, laminated substrates, or laminates used for forming the package may be either 2 or 3, and may be any number not less than 2. In the package thus formed, the convex surfaces or concave surfaces of the glass substrates face in the same direction and, hence, the spaces between the glass substrates, laminated substrates, or laminates of which the package is configured can be narrowed. Hence, the package can have a reduced size.

As a result, such a package in which the convex surfaces or concave surfaces of the glass substrates face in the same direction can contain a larger number of laminated substrates than a package of the same size in which the convex surfaces or concave surfaces of the glass substrates do not face in the same direction.

In the case where such glass substrates, laminated substrates, or laminates are to be transported while being supported, for example, by movable supporting members, it is easy to make the concave surfaces of the glass substrates supported by the supporting members, since the convex surfaces or concave surfaces of the glass substrates face in the same direction. Thus, the laminated substrates can be transported while inhibiting the glass substrates, laminated substrates, or laminates from deforming. Furthermore, since the convex surfaces or concave surfaces of the glass substrates face in the same direction, the surfaces of the substrate containing silicon on which deposition is to be performed can be made flush with each other. Thus, it is easy to control the distribution of the thickness of the film to be deposited.

It is preferable that a package according to one embodiment of the present invention should be one in which the concave surface of each glass substrate is supported at four points by supporting members. In cases where the concave surface of each glass substrate is supported at four points by supporting members, the surface of each glass substrate or laminated substrate is less apt to be contaminated with dust, etc.

A package according to one embodiment of the present invention may be housed in a container. In cases where the package is housed in a container, the package is less apt to be contaminated with dust, etc.

Next, a process for producing a glass substrate of one embodiment of the present invention is explained.

In the case of producing the glass substrate of one embodiment of the present invention, the process includes a step of melting, refining, forming, slow cooling, cutting, inspection, and marking.

In the melting step, raw materials are prepared so as to yield a glass substrate having a desired composition, and the raw materials are continuously introduced into a melting furnace and heated to preferably about 1,400-1,650° C., thereby obtaining a molten glass.

In the refining step, $SO_3$ or $SnO_2$ can be used as a refining agent for the glass substrate according to the present invention. A method of degassing under reduced pressure may be applied.

To the forming step is applied a float process in which the molten glass is poured onto a molten metal to obtain a plate-shaped glass ribbon.

In the slow cooling step, the glass ribbon is slowly cooled.

In the cutting step, glass plates are cut out of the glass ribbon and then cut into a given shape of a given size, thereby obtaining a glass substrate of one embodiment of the present invention.

In the process for producing a glass substrate of one embodiment of the present invention, for example, warpage is prone to occur when a difference in temperature between one main surface and the other main surface of the glass ribbon is large in the forming step and the ling step.

In the inspection step, whether one main surface of the glass substrate is a concave surface or a convex surface is determined with, for example, a laser displacement meter.

In the step of placing a mark, one or more marks are placed on at least one of the concave surface and convex surface of the glass substrate. Depressions are formed, for example, with a laser. By laser scanning, depressions of a desired shape are formed. Letters or symbols may be formed. Notches or OFs may be formed, for example, by forming cut lines with a cutter or a laser, followed by fracturing.

The marks formed on the glass substrate are detected, for example, by taking an image of the glass substrate with a camera and analyzing the image. Thus, the concave surface and convex surface of the glass substrate are distinguished from each other.

In the case of producing a glass substrate of one embodiment of the present invention, the molten glass may be formed into a plate shape by applying a fusion process, a roll-out method, a press forming, or the like in the forming step.

In the case of producing a glass substrate of one embodiment of the present invention, a platinum crucible may be used. In the case of using a platinum crucible, the melting step is performed in the following manner. Raw materials are prepared so as to yield a glass substrate having a given composition, and the platinum crucible containing the raw materials is introduced into an electric furnace. The raw materials are heated to preferably about 1,450-1,650° C., and a platinum stirrer is inserted thereinto to stir the contents for 1-3 hours, thereby obtaining a molten glass.

In the refining step, $SO_3$ or $SnO_2$ can be used as a fining agent. A method of degassing under reduced pressure may be applied. As a refining agent for use in the method of degassing under reduced pressure, it is preferred to use a halogen such as Cl or F. In the forming step, the molten glass is poured, for example, onto a carbon plate to form a platy glass. In the slow cooling step, the platy glass is gradually cooled to a room-temperature state. The platy glass is cut to obtain a glass substrate.

Although the present invention has been described in detail with reference to specific embodiments thereof, the invention is not limited to the embodiments and various changes and modifications can be made therein without departing from the spirit and scope thereof. This application is based on a Japanese patent application filed on Jul. 24, 2015 (Application No. 2015-147249) and a Japanese patent application filed on Dec. 28, 2015 (Application No. 2015-256895), the entire contents thereof being incorporated herein by reference. All the matters cited in these patent applications are incorporated as references into the present application.

DESCRIPTION OF REFERENCE NUMERALS AND SIGN

10 Substrate containing silicon
20 Resin
30 Laminated substrate
G1 Glass substrate

The invention claimed is:

1. A glass substrate to be laminated with a substrate containing silicon to thereby form a laminated substrate, the glass substrate having a concave surface and a convex surface,
the glass substrate having two marks formed on the concave surface and two marks formed on the convex surface that distinguish between the concave surface and the convex surface,
wherein the two marks formed on the concave surface and the two marks formed on the convex surface are each a depression in the form of at least one selected from the group consisting of a circle, an ellipse, a polygon, a letter, a symbol, and a square,
wherein the two marks formed on the concave surface and the two marks formed on the convex surface have a depth in a range of 1-50 µm,
wherein the two marks formed on the concave surface differ in shape from each other, and the two marks formed on the convex surface are in positions respectively facing the two marks formed on the concave surface and are equal in shape to the marks formed on the concave surface which they respectively face, and
where a theoretical line of shortest distance by which the two marks on the convex surface are connected to each other on the convex surface does not pass through a center of gravity on the convex surface.

2. The glass substrate according to claim 1, wherein the two marks formed on the concave surface and the two marks formed on the convex surface have a depth in a range of 3-20 μm.

3. The glass substrate according to claim 1, wherein the two marks formed on the concave surface and the two marks formed on the convex surface have a depth in a range of 4-10 μm.

4. The glass substrate according to claim 1, which has a circular shape.

5. The glass substrate according to claim 1, which has a deviation of plate thickness of 15 μm or less.

6. A laminated substrate comprising the glass substrate according to claim 1 and a substrate containing silicon, wherein a curved surface constituted of the convex surface or concave surface of the glass substrate and a curved surface constituted of a convex surface or a concave surface of the substrate containing silicon are pasted to each other so as to conform to each other.

7. A laminate comprising the laminated substrate according to claim 6 and another glass substrate that is pasted to the glass substrate.

8. A package formed by packaging two or more laminated substrates according to claim 6, wherein the laminated substrates are packaged so that the substrate containing silicon of one of the laminated substrates faces the concave surface of the glass substrate of another laminated substrate.

9. A package formed by packaging two or more glass substrates according to claim 1, wherein the glass substrates are packaged so that the convex surface of one of the glass substrates faces the concave surface of another glass substrate.

10. A process for producing a laminated substrate, the process comprising pasting a curved surface constituted of the convex surface or concave surface of the glass substrate according to claim 1 and a curved surface constituted of a convex surface or concave surface of a substrate containing silicon to each other so as to conform to each other.

11. A process of producing the glass substrate according to claim 1, the process comprising:
heating raw materials for glass to obtain molten glass;
forming the molten glass into a plate shape to obtain a glass ribbon;
slowly cooling the glass ribbon to obtain a cooled glass ribbon;
cutting the cooled glass ribbon to obtain an unmarked glass substrate;
distinguishing between a concave surface and a convex surface of the unmarked glass substrate; and
placing two marks on the concave surface and two marks on the convex surface to obtain the glass substrate.

12. A glass substrate to be laminated with a substrate containing silicon to thereby form a laminated substrate, the glass substrate having a concave surface and a convex surface,
the glass substrate having two marks formed on the concave surface and two marks formed on the convex surface that distinguish between the concave surface and the convex surface,
wherein the two marks formed on the concave surface and the two marks formed on the convex surface are each a depression in the form of at least one selected from the group consisting of a circle, an ellipse, a polygon, a letter, a symbol, and a square,
wherein the two marks formed on the concave surface and the two marks formed on the convex surface have a depth in a range of 1-50 μm,
wherein the two marks formed on the concave surface differ from each other in distance from a center of gravity on the concave surface, and the two marks formed on the convex surface are in positions respectively facing the two marks formed on the concave surface and are equal in shape to the marks formed on the concave surface which they respectively face, and
where a theoretical line of shortest distance by which the two marks on the convex surface are connected to each other on the convex surface does not pass through a center of gravity on the convex surface.

13. The glass substrate according to claim 12, wherein the two marks formed on the concave surface and the two marks formed on the convex surface have a depth in a range of 3-20 μm.

14. The glass substrate according to claim 12, wherein the two marks formed on the concave surface and the two marks formed on the convex surface have a depth in a range of 4-10 μm.

15. The glass substrate according to claim 12, which has a circular shape.

16. The glass substrate according to claim 12, which has a deviation of plate thickness of 15 μm or less.

17. A laminated substrate comprising the glass substrate according to claim 12 and a substrate containing silicon, wherein a curved surface constituted of the convex surface or concave surface of the glass substrate and a curved surface constituted of a convex surface or a concave surface of the substrate containing silicon are pasted to each other so as to conform to each other.

18. A laminate comprising the laminated substrate according to claim 17 and another glass substrate that is pasted to the glass substrate.

19. A package formed by packaging two or more laminated substrates according to claim 17, wherein the laminated substrates are packaged so that the substrate containing silicon of one of the laminated substrates faces the concave surface of the glass substrate of another laminated substrate.

20. A package formed by packaging two or more glass substrates according to claim 12, wherein the glass substrates are packaged so that the convex surface of one of the glass substrates faces the concave surface of another glass substrate.

21. A process for producing a laminated substrate, the process comprising pasting a curved surface constituted of the convex surface or concave surface of the glass substrate according to claim 12 and a curved surface constituted of a convex surface or concave surface of a substrate containing silicon to each other so as to conform to each other.

22. A process of producing the glass substrate according to claim 12, the process comprising:
heating raw materials for glass to obtain molten glass;
forming the molten glass into a plate shape to obtain a glass ribbon;
slowly cooling the glass ribbon to obtain a cooled glass ribbon;
cutting the cooled glass ribbon to obtain an unmarked glass substrate;
distinguishing between a concave surface and a convex surface of the unmarked glass substrate; and
placing two marks on the concave surface and two marks on the convex surface to obtain the glass substrate.

* * * * *